US 8,525,719 B2

(12) United States Patent
Schreiner et al.

(10) Patent No.: US 8,525,719 B2
(45) Date of Patent: Sep. 3, 2013

(54) ELECTRONIC DEVICE AND METHOD FOR ANALOG TO DIGITAL CONVERSION USING SUCCESSIVE APPROXIMATION

(75) Inventors: Joerg Schreiner, Furstenfeldbruck (DE); Bernhard Ruck, Freising (DE); Harinath Renukamurthy, Freising (DE)

(73) Assignee: Texas Instruments Incorporated Deutschland, GmbH, Freising (DE)

( * ) Notice: Subject to any disclaimer, the term of this patent is extended or adjusted under 35 U.S.C. 154(b) by 0 days.

(21) Appl. No.: 13/050,483

(22) Filed: Mar. 17, 2011

(65) Prior Publication Data

US 2013/0135125 A1    May 30, 2013

(30) Foreign Application Priority Data

Mar. 17, 2010   (DE) .......................... 10 2010 011 765

(51) Int. Cl.
*H03M 1/34* (2006.01)
(52) U.S. Cl.
USPC ........... 341/163; 341/135; 341/140; 341/155; 341/158; 341/160
(58) Field of Classification Search
USPC ................................. 341/130–155
See application file for complete search history.

(56) References Cited

U.S. PATENT DOCUMENTS

| | | | | |
|---|---|---|---|---|
| 5,736,953 A | * | 4/1998 | Yamaguchi | 341/163 |
| 6,008,749 A | * | 12/1999 | Smith | 341/163 |
| 6,567,021 B1 | * | 5/2003 | Burns | 341/163 |
| 7,432,844 B2 | * | 10/2008 | Mueck et al. | 341/163 |
| 7,439,898 B1 | * | 10/2008 | Nittala et al. | 341/163 |
| 7,782,234 B2 | * | 8/2010 | Ahmad | 341/163 |
| 7,916,063 B1 | * | 3/2011 | Portmann et al. | 341/163 |
| 7,952,509 B2 | * | 5/2011 | Aruga et al. | 341/163 |
| 8,081,097 B2 | * | 12/2011 | Hsu | 341/163 |
| 8,134,487 B2 | * | 3/2012 | Harpe | 341/163 |
| 8,164,504 B2 | * | 4/2012 | Cho et al. | 341/172 |
| 8,362,940 B2 | * | 1/2013 | Yoshioka | 341/163 |
| 8,390,501 B2 | * | 3/2013 | Chang et al. | 341/163 |

FOREIGN PATENT DOCUMENTS

DE          10139488 C1     8/2001

* cited by examiner

*Primary Examiner* — Lam T Mai
(74) *Attorney, Agent, or Firm* — Robert D. Marshall, Jr.; Wade James Brady, III; Frederick J. Telecky, Jr.

(57) ABSTRACT

The invention includes a successive approximation register, a digital-to-analog converter, a comparator and a control stage. The control stage initially sets the successive approximation register to a first digital value. The digital-to-analog converter converts the digital value stored in the successive approximation register to an analog value. The comparator compares the converted digital value with an analog input value. The control stage restricts subsequent analog-to-digital conversion for the analog input value to a search interval above or below the first digital value depending on whether the analog input value is greater or lower than the converted analog value of the first digital value.

14 Claims, 5 Drawing Sheets

| Pb | 2 | 3 | 4 | 5 | 6 | 7 | 8 | 9 | 10 | 11 | 12 |
|---|---|---|---|---|---|---|---|---|---|---|---|
| 0 | 115.38% | 115.38% | 115.38% | 115.38% | 115.38% | 115.38% | 115.38% | 115.38% | 115.38% | 115.38% | 115.38% |
| 0.1 | 106.15% | 106.92% | 107.69% | 108.46% | 109.23% | 110.00% | 110.77% | 111.54% | 112.31% | 113.08% | 113.85% |
| 0.2 | 96.92% | 98.46% | 100.00% | 101.54% | 103.08% | 104.62% | 106.15% | 107.69% | 109.23% | 110.77% | 112.31% |
| 0.3 | 87.69% | 90.00% | 92.31% | 94.62% | 96.92% | 99.23% | 101.54% | 103.85% | 106.15% | 108.46% | 110.77% |
| 0.4 | 78.46% | 81.54% | 84.62% | 87.69% | 90.77% | 93.85% | 96.92% | 100.00% | 103.08% | 106.15% | 109.23% |
| 0.5 | 69.23% | 73.08% | 76.92% | 80.77% | 84.62% | 88.46% | 92.31% | 96.15% | 100.00% | 103.85% | 107.69% |
| 0.6 | 60.00% | 64.62% | 69.23% | 73.85% | 78.46% | 83.08% | 87.69% | 92.31% | 96.92% | 101.54% | 106.15% |
| 0.7 | 50.77% | 56.15% | 61.54% | 66.92% | 72.31% | 77.69% | 83.08% | 88.46% | 93.85% | 99.23% | 104.62% |
| 0.8 | 41.54% | 47.69% | 53.85% | 60.00% | 66.15% | 72.31% | 78.46% | 84.62% | 90.77% | 96.92% | 103.08% |
| 0.9 | 32.31% | 39.23% | 46.15% | 53.08% | 60.00% | 66.92% | 73.85% | 80.77% | 87.69% | 94.62% | 101.54% |
| 1 | 23.08% | 30.77% | 38.46% | 46.15% | 53.85% | 61.54% | 69.23% | 76.92% | 84.62% | 92.31% | 100.00% |

ELECTRONIC DEVICE AND METHOD FOR ANALOG TO DIGITAL CONVERSION USING SUCCESSIVE APPROXIMATION

CLAIM OF PRIORITY

This application claims priority under 35 U.S.C. 119(a) to German Patent Application No. 10 2010 011 765.0 filed Mar. 17, 2010.

TECHNICAL FIELD OF THE INVENTION

The technical field of this invention is an electronic device for analog-to-digital conversion using successive approximation and to a method for analog-to-digital conversion using successive approximation.

BACKGROUND OF THE INVENTION

Analog-to-digital converters (ADC) play an important role in microcontroller based systems. Nowadays, there is a strong trend towards low power design of microcontroller based systems and since ADCs consume significant power during their operation, it becomes imperative to build low power ADCs.

An ADC according to the invention works with successive approximation, well known as one of the basic principles for analog-to-digital conversion. A typical ADC comprises a successive approximation register SAR, a digital-to-analog converter DAC, a comparator COMP and a sample and hold stage SHS. The basic functionality of an ADC using successive approximation will be explained with reference to FIG. 1.

During a first clock cycle that is triggered by the clock input CLK, an input voltage VIN that is sampled by the SHS is compared to a reference voltage VREF. If the result of the comparison indicates that VIN is greater than VREF, a respective bit decision relating to the most significant bit (MSB) is made. During a subsequent cycle, the next less significant bit (MSB−1) is determined. The conversion procedure carries on accordingly and the DAC output voltage converges successively to the analog input voltage VIN, while evaluating one bit during each clock cycle. When the conversion is completed, the status of the SAR is the digitized representation of VIN. This digital value is output by the ADC and the SHS samples the next analog input voltage VIN to be converted.

For precise analog-to-digital conversion, capacitive DACs are frequently used in ADCs. FIG. 2 shows a capacitive DAC stage comprising a plurality of capacitors C ... C128. Each capacitor C ... C128 is associated to one bit, i.e. C is associated to the least significant bit (LSB), C2 is associated to LSB+1, C4 is associated to LSB+2, etc. The exemplary digitization depth is 8-bit and accordingly, C128 is associated to the eight and most significant bit (MSB). The ratio between the capacities of capacitors C ... C128 equals their bit indices. For example, the ratio between the capacitances C4 and C128 is equal to 4 to 128.

Before the first clock cycle of analog-to-digital conversion occurs, the SAR is initialized by a reset. This means that all capacitors C ... C128 are set to a common potential defined as low. During the first clock cycle, the MSB is set to high, i.e. capacitor C128 is charged by setting it to a predetermined second potential. All other capacitors remain at low. The resulting voltage VCOMP is output by the capacitive ADC to the comparator COMP and depending on whether the analog input voltage VIN is greater or lower than VCOMP the MSB is left at high or set to low. During the next clock cycle MSB−1 is determined by charging C64 and performing the same test at the comparator COMP between the new value of VCOMP and VIN. Successively, VCOMP approaches VIN bit by bit as shown in FIG. 3.

The successive approximation register SAR is shown in more detail in FIG. 4. During each bit decision, the successive approximation register SAR stores the status of capacitors C ... C128. The SAR comprises a sequencer having a plurality of flip-flops F ... FN and a code register comprising a plurality of flip-flops R0 ... RN. At the beginning of analog-to-digital conversion all flip-flops are set to low. During each clock cycle the state of one flip-flop of the code register is determined. The final state of the flip-flops is the digital code, i.e. the digital approximation of VIN and is finally output by the SAR of the ADC at the end of conversion.

An advantage of the successive approximation procedure according to the prior art is its simplicity and predictability. Within n+1 cycles, wherein n is the number of analog-to-digital conversion resolution bits, also known as a digitization depth (in the previous example n=8), the result is available to the remainder of the system.

However, the above described method of analog-to-digital conversion is power consuming. The main power consuming elements throughout the n+1 cycles are the comparator and the charging and discharging of the capacitor array. Most power reduction techniques known in the art focus on improvements in one or more of these elements.

SUMMARY OF THE INVENTION

It is an object of the invention to provide an electronic device for analog-to-digital conversion using successive approximation and a method for analog-to-digital conversion using successive approximation having less power consumption than solutions according to the prior art.

The invention provides an electronic device for analog-to-digital conversion using successive approximation. The device comprises a successive approximation register, an analog-to-digital converter, a comparator and a control stage. The control stage is adapted to set the successive approximation register to a first digital value. This means that the successive approximation register is initialized with a first digital value. Instead of being reset, the successive approximation register is set to the first digital value. The first digital value may be the result of a complete and successful analog-to-digital conversion (performed before the step of setting the successive approximation register to the first digital value). Alternatively, the first digital value may be a predetermined value representing an analog value, for example the value of a fixed voltage. The first digital value may indicate the respective state of the successive approximation register, i.e. the states for all digitized bits. The analog-to-digital converter may then be adapted to output the first digital value to the digital-to-analog converter. The digital-to-analog converter may be adapted to convert the first digital value to an analog value and to output the analog value to the comparator for comparing it with an analog input value. The analog input value may be fed to the electronic device through an input channel that preferably comprises a sample and hold stage. One side of the comparator may be coupled to the digital-to-analog converter while its other side may be coupled to receive the other analog input value through the input channel for comparing the analog input value with the converted first digital value. The comparator is adapted to output a result of the comparison to the control stage that is further adapted to restrict a subsequent analog-to-digital conversion to a search interval being arranged above or below a first digital value. The interval is arranged above the first digital value if the result that is output by the comparator indicates that the analog value is greater than the converted analog value of the first digital value. The interval is arranged below the first digital value if the result that is output by the comparator indicates that the analog value is lower than the converted analog value of the first digital value.

In other words, depending on whether the analog input signal to be converted is increasing or decreasing the digital-to-analog conversion is restricted to a search interval being located above or below (i.e. the interval covers values greater or lower) the first digital value of the first analog input value. If the analog input value is greater than the first analog input value, the signal is increasing and if the analog input value is smaller than the first analog input value, the signal is decreasing.

Advantageously, the electronic device for analog-to-digital conversion consumes less power compared to conventional devices since the analog-to-digital conversion converges faster. This is due to the fact that the first digital value is a good starting point for digitizing of the analog input value. Significant power savings derive from the fact that it is very likely to happen that in a subsequent analog-to-digital conversion decision the most significant bit (MSB) remains unchanged and much electric power is necessary for changing the MSB from low to high as it is usual at the beginning of conventional digitization methods. It is further very likely to happen that the electronic device according to the invention leaves the next less significant bit (MSB−1) and even the next bit (MSB−2) unchanged and only changes the less significant bits to achieve the digital approximation of the second analog input value. Since altering the prefix of the significant bits are the most power consuming cycles during digitization, significant power savings can be expected.

It is further advantageous that the electronic device according to the invention can be implemented using a fairly small number of digital logic gates and the analog portion of the electronic device can remain unchanged as it is known from conventional analog-to-digital converters. Analog parameters of sub-modules do not have to be changed, which allows a fast and simple integration of the analog-to-digital converter according to the invention into the existing production. Since techniques known in the art mainly face a reduction of power consumption by slowing down the comparator, the speed of analog-to-digital conversion is reduced. The electronic device according to the invention is advantageous since it can even increase the speed of conversion. This is due to the fact that the analog-to-digital conversion process converges faster because of its good starting point. A further advantage resides in the fact that due to fast convergence less digitization cycles and accordingly less alternations of bit prefixes are necessary.

According to a further aspect of the invention, the control stage of the electronic device is adapted to determine whether the analog input value is located inside the search interval. If this is the case, the control stage is adapted to restrict the analog-to-digital conversion to the search interval and in case the analog input value is not located inside the search interval, the control stage is adapted to reset the successive approximation register. The electronic device advantageously makes use of the fact that most of the real world signals, on which analog-to-digital conversion is usually operated, are continuous in time domain. This implies that the next value of an analog input signal will be in the vicinity of the present value, in other words the analog input value is expected to be located in the vicinity of the first analog input value. Hence, it has been found that the first digital value is a good starting point for analog-to-digital conversion of the analog input value. However, also non-continuous signals may be processed by the electronic device for analog-to-digital conversion. In case of such a non-continuous or heavily changing input signal, the input value will not be found in the vicinity of the first analog input value and accordingly the input value will probably not be located inside the search interval. As a reaction, the electronic device steps back to successive approximation as it is known in the art and starts with a reset of the successive approximation register. Advantageously, the electronic device is very flexible because it can process continuous as well as non-continuous input data.

According to another aspect of the invention, the control stage is adapted to determine the search interval by adding or subtracting a threshold value to or from the first digital value. The binary representation of the threshold value may be equal to $2^k$ with k corresponding to the number of analog-to-digital conversion bits used for the first analog-to-digital conversion decision. Preferably, the control stage of the electronic device may be adapted to set k to a predetermined fraction of the number of analog-to-digital conversion bits. Further preferably k may be set to n/2 wherein n is the number of analog-to-digital resolution bits. Advantageously, a small search interval may be used for successive approximation which is expected to converge faster.

The control stage of the electronic device is further preferably adapted to detect whether due to addition or subtraction of the threshold value an overflow occurs. If an overflow is detected, the control stage may be adapted to set the upper or lower limit of the search interval to the respective overflow threshold values. Advantageously, erroneous determination of the search interval may be prevented due to this measure.

The invention also provides a method of operating an electronic device for analog-to-digital conversion using successive approximation. The electronic device comprises a successive approximation register, a digital-to-analog converter and a comparator. The successive approximation register may be set at a first digital value that is indicative to a first analog-to-digital conversion decision. The first digital value may be sent from the successive approximation register to the analog-to-digital converter. The first digital value may be converted to an analog value with the digital-to-analog converter and the converted analog value may be sent to the comparator. The converted analog value may be compared with an analog input value and a result of the comparison may be sent to the control stage. A second analog-to-digital conversion may be restricted to a search interval being arranged above or below the first digital value depending on whether the result that is output by the comparator indicates that the analog input value is greater or lower than the converted analog value of the first digital value.

The method according to the invention allows a fast and economic analog-to-digital conversion. Further advantages are similar or comparable to the advantages known from the electronic device according to the invention.

BRIEF DESCRIPTION OF THE DRAWINGS

These and other aspects of this invention are illustrated in the drawings, in which:

FIG. 8 shows a diagram illustrating the ratio between power consumption of an ADC according to an embodiment of the invention and the power consumption by a conventional ADC.

DETAILED DESCRIPTION OF PREFERRED EMBODIMENTS

Figure 1:
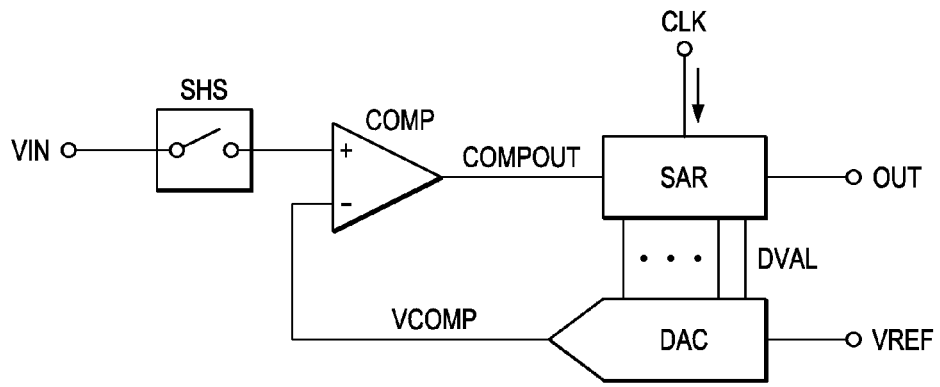
FIG. 1 is a simplified circuit diagram of an analog-to-digital converter according to the prior art.
Figure 2:
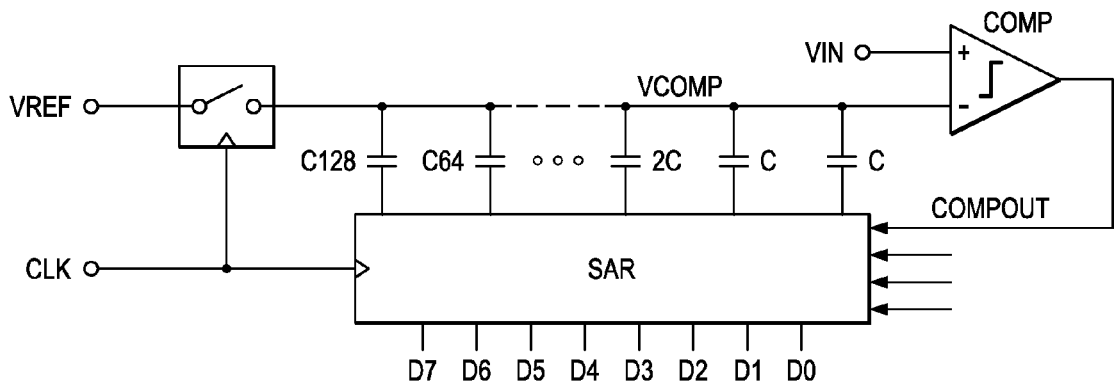
FIG. 2 is a simplified circuit diagram of a digital-to-analog converter, which is included in the analog-to-digital converter shown in FIG. 1.
Figure 3:
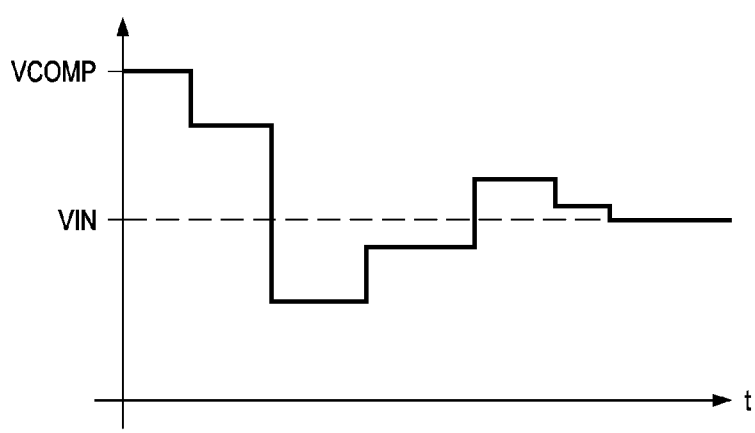
FIG. 3 is a schematic diagram illustrating the digital approximation of an analog input voltage VIN according to the prior art.
Figure 4:
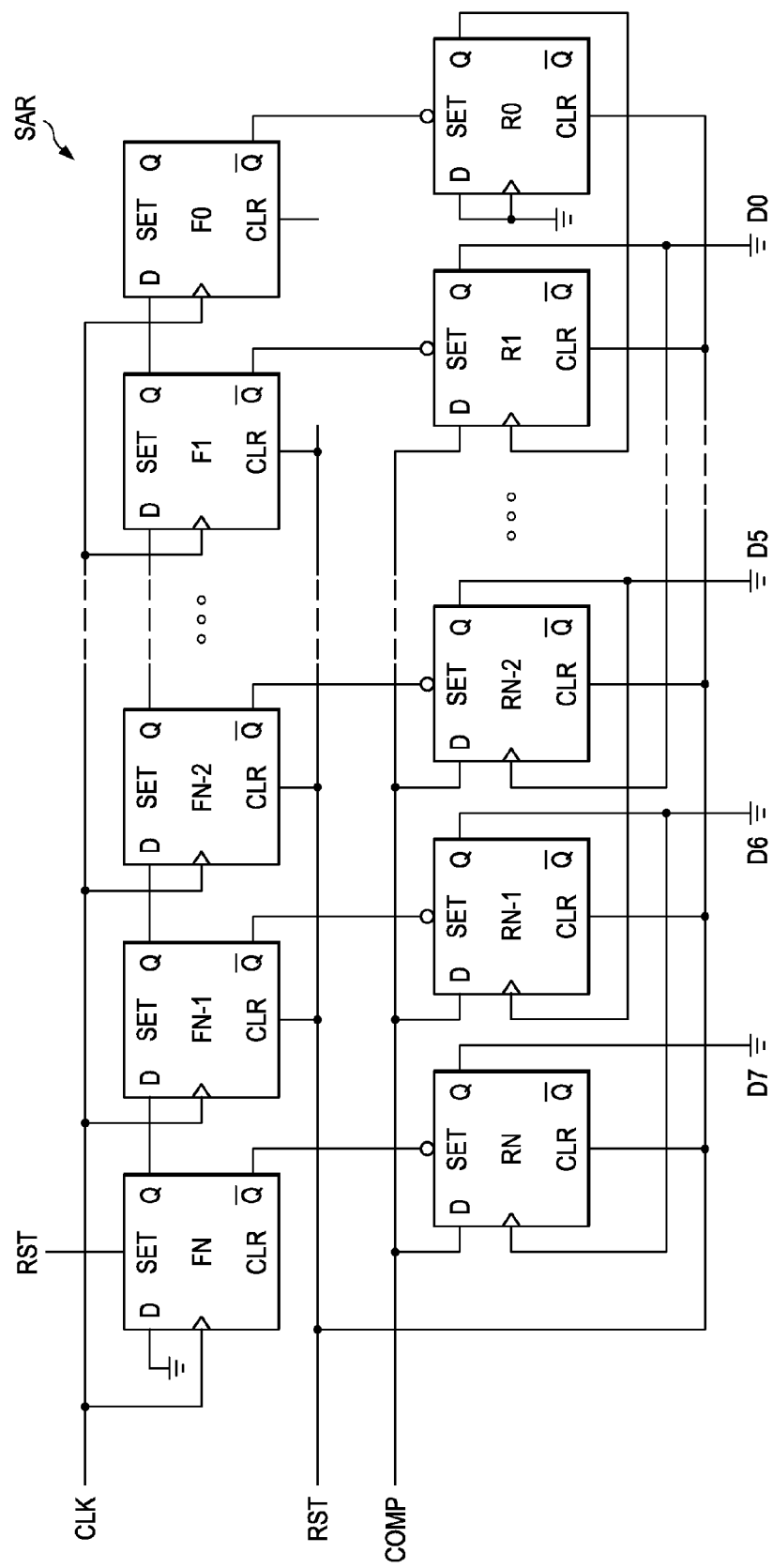
FIG. 4 is a simplified circuit diagram of a successive approximation register according to the prior art.

The procedure of converting an analog input voltage into a digital value according to aspects of the invention will be explained with reference to FIG. 5. A first analog input value may successfully be converted into a first digital value in a conventional analog-to digital conversion step using successive approximation. Alternatively, the first digital value may be a predetermined value derived from or determined with respect to a fixed analog value, for example a voltage level that is expected to be constant or to remain within a specific voltage range. The converted analog value of the first digital value may then be code P. In a first step of the method of operating an electronic device for analog-to digital conversion according to an embodiment of the invention, code P and an analog input value referred to as SAMPLE are compared. The analog input value can be a CPU voltage, a voltage representing a physical quantity, e.g. a time dependent temperature. The step of comparing code P and SAMPLE is performed by comparator COMP as explained with respect to FIGS. 1 and 2. SAMPLE is one particular value of the input value VIN. In case code P is smaller than SAMPLE, code H is set equal to code $P+2^k$. In a next step, it is decided whether SAMPLE is smaller than code H and if this is the case, the search interval for analog-to-digital conversion of SAMPLE is restricted to an interval defined by code P as a lower threshold and code H as an upper threshold. In case code H is not greater than SAMPLE, the value of SAMPLE is located outside the search interval and consequently code P, which may be the starting point of analog-to-digital conversion is reset. This means analog-to-digital conversion of SAMPLE starts with the successive approximation register (SAR) and the digital-to-analog converter (DAC), especially the capacitors C . . . C128 of the DAC (as shown in FIG. 2) being reset. Analog-to-digital conversion is performed as known in the art by completely searching the given conversion interval.

Figure 5:
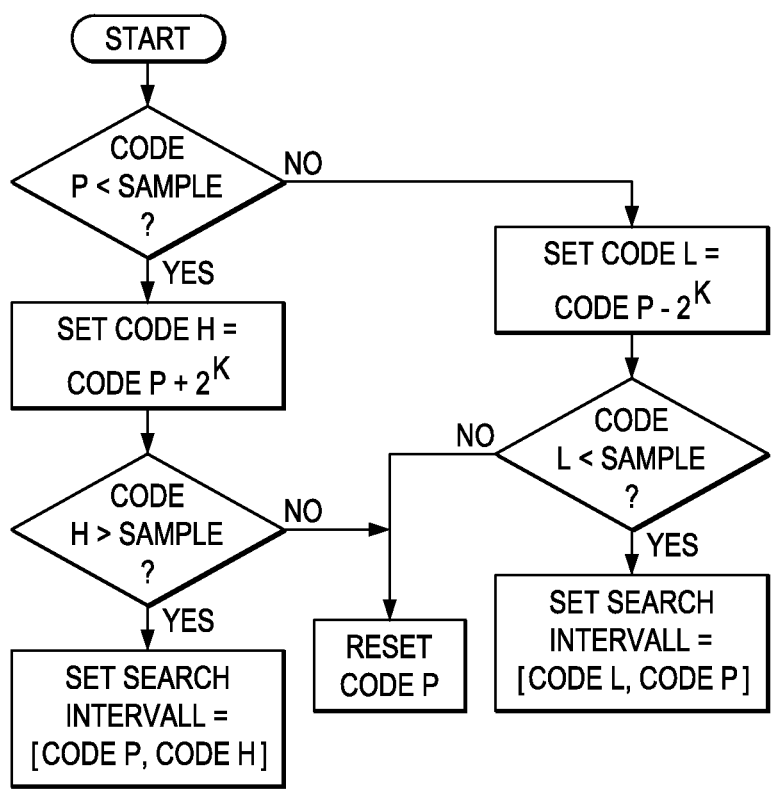
FIG. 5 is a flowchart of a method of operating an electronic device for analog-to-digital conversion according to an embodiment of the invention.

If the decision in the first step of the method shown in FIG. 5 is negative, this means code P is not smaller than SAMPLE, the method follows the branch "NO". In contrast to the "YES"-branch, the signal in question is not increasing, i.e. code P is smaller than the subsequent value (represented by SAMPLE) but decreasing. Accordingly, code L is set equal to code $P-2^k$ and in a next step it is determined whether code L is smaller than SAMPLE or not. When code L is smaller than sample, the search interval is given by code L as the lower threshold and by code P as the upper threshold. This means the search interval is set adjacent to code P but due to the fact that the signal decreasing, it is located below code P and not above, as mentioned before. In case code L is not smaller than SAMPLE, this means that SAMPLE is not located inside the search interval, code P is reset and again analog-to-digital conversion is performed in a conventional way.

The size of the search interval is defined by the value $2^k$ in its binary representation. Preferably, k may be a user definable and pre-determined value that may be further selected close to or equal to n/2, wherein n is the number of analog-to-digital conversion resolution bits.

Figure 6:
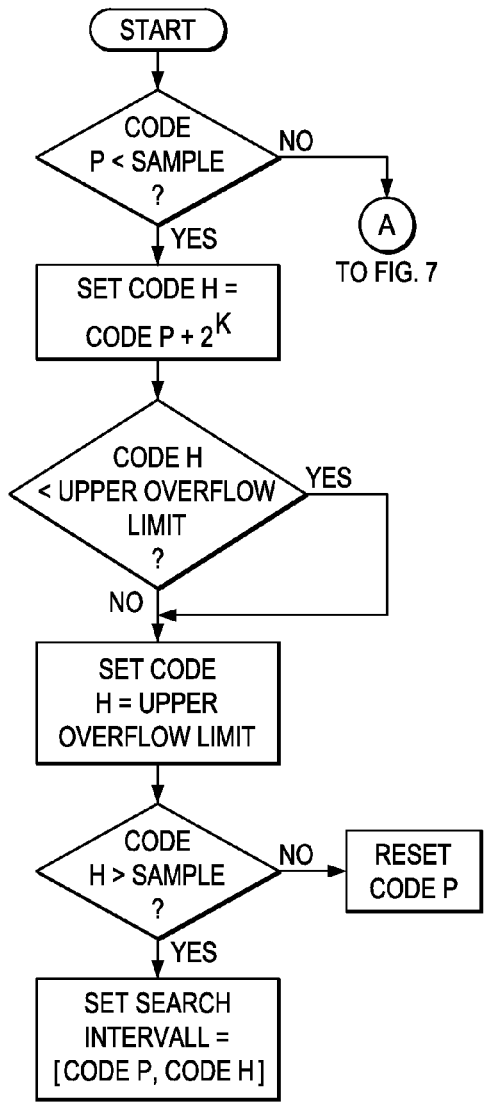
FIGS. 6 and 7 show a flowchart of a method of operating an electronic device for analog-to-digital conversion according to an embodiment of the invention.
Figure 7:
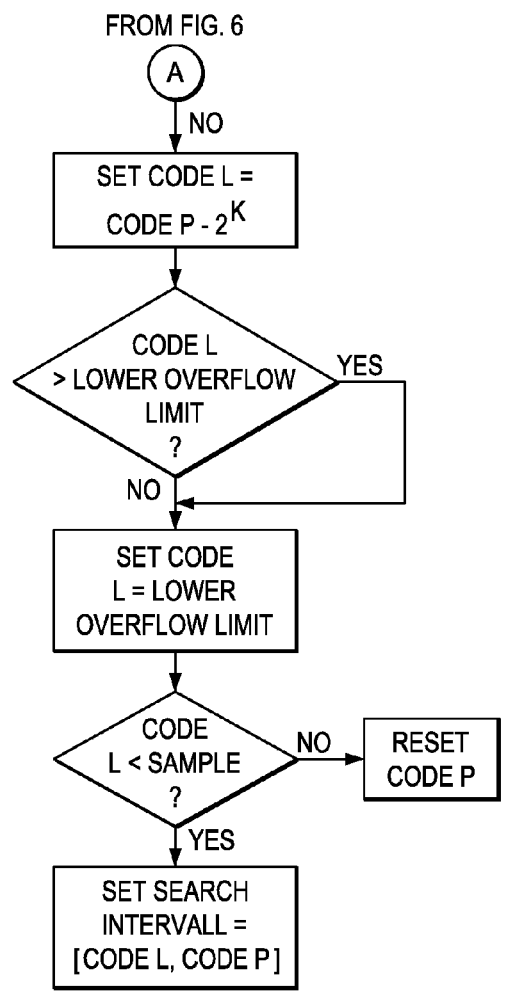

Depending on the position of code P inside the search interval and further depending on the value k, i.e. the size of the search interval, addition or subtraction of $2^k$ may cause an overflow. In order to prevent such an overflow, an overflow check may be integrated into the method for operating the electronic device for analog-to-digital conversion. A corresponding flowchart is shown in FIGS. 6 and 7. The flowchart is based on the flowchart already known from FIG. 5. The method starts with a comparison between code P and SAMPLE. In case code P is smaller than SAMPLE, the "YES"-branch leads to code H being equal to code $P+2^k$. In this step, the search interval is established above code P. In the next step it is determined whether code H is smaller than an upper overflow limit and in case of "YES", the method proceeds. In case of "NO", code H is set equal to the upper overflow limit to prevent overflow errors. As already known from FIG. 5, it is determined whether SAMPLE is smaller than code H in a next step. This means that SAMPLE is located inside the search interval determined by code P as a lower threshold and code H as an upper threshold. In case SAMPLE is not situated inside the search interval code P is reset.

FIG. 7 shows the "NO"-branch of the flowchart beginning in FIG. 6, this means that SAMPLE is not greater than code P and the signal to be digitalized is falling. Accordingly, the search interval is defined by subtracting $2^k$ from code P and defining it as code L. In the next step, it is determined whether Code L is greater than a lower overflow limit and in case of "YES", the method proceeds. In case of "NO", Code L is set equal to the lower overflow limit in order to prevent overflow errors. As already known, in a next step it is determined whether SAMPLE is located inside the search interval defined by Code L as the lower threshold and code P as an upper threshold by determining whether SAMPLE is greater than code L. In case of "YES", the search interval is defined as mentioned and in case of "NO", code P is reset and analog-to-digital conversion is performed by searching the complete search interval.

As a further option, the electronic device may comprise a bypass functionality. This means that the logic section of the ADC can be set so that determination of search interval is completely omitted and the ADC becomes similar to a known ADC using successive approximation in a conventional way, i.e. searching the complete digitization search interval.

In the following, a brief power analysis illustrating the power saving capabilities of the electronic device according to the invention and the method for operating the same will be given. Whenever the second analog value to be digitized, according to the above mentioned flowcharts the value of SAMPLE lies within the $\pm 2^k$ limit, this means lying either inside the lower search interval [code P, code H] or inside the upper search interval [code L, code P], the analog-to-digital conversion takes k+1 steps to converge. Preferably at the end of conversion (EOC) the ADC is shut down until the next start of conversion (SOC) signal is obtained. This can lead to additional power savings.

In case the value of SAMPLE lies outside the $\pm 2^k$ limit, the analog-to-digital conversion will take n+3 cycles. This is two cycles more than in usual operation of an ADC using conventional successive approximation. This may be regarded as a penalty for a value outside the assumed limits, i.e. outside the $\pm 2^k$ limits. The probability of a subsequent value being located within the ±$2^k$ limit may be given by Pb. Then the total power consumption Power Node of an ADC according to an embodiment of the invention is roughly given by:

$$\text{PowerNode}=[Pb*(K+1)+(1-Pb)*(N+3)]\text{POWC}$$

with POWC being the power consumed during one cycle of analog-to-digital conversion.

For conventional operation of an ADC using conventional successive approximation the power is roughly given by:

$$\text{PowerADC}=(N+1)\text{POWC}$$

The ratio between the power of Nadc (ADC according to aspects of the invention) vs. ADC (ADC according to the prior art) is calculated for a plurality of combinations and given in a table shown in FIG. 8, in this example, a 12 bit analog-to-digital conversion is performed. The table shows that significant power savings can be expected by proper selection of the value of k so that the probability of tracking the signal within the ±$2^k$ limit is maximized.

Depending on the input waveform, it is demonstrated that the electronic device and method of operating the same according to the invention leads to power savings in the range of 30 to 50% over and above existing power saving schemes in conventional ADCs.

Although the invention has been described hereinabove with reference to a specific embodiment or embodiments, it is not limited to this or these embodiments and no doubt further alternatives will occur to the skilled person that lie within the scope of the invention as claimed.

What is claimed is:

1. An electronic device for analog-to-digital conversion using successive approximation, the device comprising:
    a successive approximation register storing a digital value;
    a digital-to-analog converter coupled to said successive approximation register, said digital-to-analog converter adapted to convert said digital value stored in said successive approximation register into an analog value and output said analog value;
    a comparator coupled to said digital-to-analog converter and receiving an analog input value, said comparator adapted to compare said analog value output from said digital-to-analog converter with said analog input value and generate a comparison signal;
    a control stage connected to said successive approximation register and said comparator, said control stage adapted to
        load a first digital value into said successive approximation register,
        increase said digital value stored said successive approximation register if said comparison signal indicates said analog value output from said digital-to-analog converter is less than said analog input value, and
        decrease said digital value stored said successive approximation register if said comparison signal indicates said analog value output from said digital-to-analog converter is greater than said analog input value.

2. The electronic device according to claim 1, wherein:
said first digital value results from a first analog-to-digital conversion.

3. The electronic device according to claim 1, wherein:
said first digital value represents a predetermined analog input value.

4. The electronic device according to claim 1, wherein:
said control stage is further adapted to
    determine whether said analog input value is located within a search interval;
    restrict subsequent analog-to-digital conversion to said search interval if said analog input value is within said search interval, and
    reset said successive approximation register if said analog input value is not within said search interval.

5. The electronic device according to claim 4, wherein:
said control stage determines said search interval by adding a threshold value to said first digital value and subtracting said threshold value from said first digital value, wherein said threshold value is equal to $2^K$ with K corresponding to the number of analog-to-digital conversion bits used for the first analog-to-digital conversion decision.

6. The electronic device according to claim 5, wherein:
said control stage sets K to a predetermined fraction of a number of analog-to-digital conversion bits.

7. The electronic device according to claim 5, wherein:
said control stage
    detects whether addition of said threshold value to said first digital value or subtraction of said threshold value from said first digital value results in an overflow, and
    set a respective upper limit or lower limit of said search interval to an overflow threshold value upon detection of an overflow.

8. A method for operating an electronic device for analog-to-digital conversion using successive approximation, the electronic device including a successive approximation register, a digital-to-analog converter and a comparator, the method comprising the steps of:
    setting the successive approximation register to a first digital value;
    converting the first digital value to an analog value;
    comparing an analog input value with the converted first digital value;
    restricting a subsequent analog-to-digital conversion to a search interval above the first digital value if comparison indicates that the analog input value is greater than the converted analog value of the first digital value; and
    restricting a subsequent analog-to-digital conversion to a search interval below the first digital value if the comparison indicates that the analog input value is less than the converted analog value of the first digital value.

9. The method according to claim 8, wherein:
the successive approximation register is set to a first digital value indicative of a first analog-to-digital conversion decision made for a first analog input value.

10. The method according to claim 8, wherein:
the successive approximation register is set to a first digital value indicative of a first analog-to-digital conversion decision made either for a predetermined analog input value.

11. The method according to claim 8, further comprising the steps of:
    determining whether said analog input value is located within a search interval;
    restricting subsequent analog-to-digital conversion to said search interval if said analog input value is within said search interval, and
    resetting said successive approximation register if said analog input value is not within said search interval.

12. The method according to claim 11, further comprising the step of:
    determining the search interval by adding a threshold value to said first digital value and subtracting said threshold value from said first digital value, wherein said threshold value is equal to $2^K$ with K corresponding to the number of analog-to-digital conversion bits used for the first analog-to-digital conversion decision.

13. The method according to claim 12, wherein:
K is a predetermined fraction of the total number n of analog to digital conversion bits.

14. The method according to claim 13, further comprising the step of:
detecting whether addition of said threshold value to said first digital value or subtraction of said threshold value from said first digital value results in an overflow, and
setting a respective upper limit or lower limit of said search interval to an overflow threshold value upon detection of an overflow.

\* \* \* \* \*